US010177158B1

(12) United States Patent
Hsieh et al.

(10) Patent No.: US 10,177,158 B1
(45) Date of Patent: Jan. 8, 2019

(54) METHOD OF MANUFACTURING A STATIC RANDOM ACCESS MEMORY (SRAM) USING FINFETS WITH VARYING WIDTHS OF FIN STRUCTURES

(71) Applicant: TAIWAN SEMICONDUCTOR MANUFACTURING CO., LTD., Hsinchu (TW)

(72) Inventors: Chih-Hung Hsieh, Hsin-Chu (TW); Jhon Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/102,169

(22) Filed: Aug. 13, 2018

Related U.S. Application Data

(62) Division of application No. 15/340,025, filed on Nov. 1, 2016, now Pat. No. 10,050,043.

(Continued)

(51) Int. Cl.
*H01L 21/8234* (2006.01)
*H01L 27/11* (2006.01)
(Continued)

(52) U.S. Cl.
CPC .. *H01L 27/1104* (2013.01); *H01L 21/823418* (2013.01); *H01L 21/823431* (2013.01);
(Continued)

(58) Field of Classification Search
CPC ...... H01L 21/823418; H01L 21/823431; H01L 27/1104; H01L 27/11582; H01L 27/0886; H01L 27/092; H01L 29/0649
See application file for complete search history.

(56) References Cited

U.S. PATENT DOCUMENTS 10,050,043 B2 * 8/2018 Hsieh .................. H01L 27/0886
2007/0161171 A1 7/2007 Burnett et al.
(Continued)

FOREIGN PATENT DOCUMENTS

KR 10-2013-0083358 A 7/2013
KR 10-2014-0002449 A 1/2014
(Continued)

OTHER PUBLICATIONS

Korean Office Action issued in corresponding Korean Application No. 10-2016-0176274, dated Nov. 14, 2017.
(Continued)

*Primary Examiner* — Andrew Q Tran
(74) *Attorney, Agent, or Firm* — McDermott Will & Emery LLP

(57) ABSTRACT

In a method of manufacturing a semiconductor device, a first fin structure, a second fin structure and a third fin structure, which extend in a first direction, are formed over a substrate. A first gate structure is formed over the first to third fin structures. The first gate structure extends in a second direction crossing the first direction. The first fin structure and the second fin structure are arranged adjacent to each other, and widths of the first and second fin structures in the second direction are smaller than a width of the third fin structure in the second direction.

20 Claims, 8 Drawing Sheets

Related U.S. Application Data

(60) Provisional application No. 62/289,157, filed on Jan. 29, 2016.

(51) Int. Cl.
*H01L 49/02* (2006.01)
*H01L 27/092* (2006.01)
*H01L 27/11582* (2017.01)
*H01L 29/06* (2006.01)
*H01L 27/088* (2006.01)

(52) U.S. Cl.
CPC ........ *H01L 27/0886* (2013.01); *H01L 27/092* (2013.01); *H01L 27/11582* (2013.01); *H01L 28/00* (2013.01); *H01L 29/0649* (2013.01)

(56) References Cited

U.S. PATENT DOCUMENTS

| | | |
|---|---|---|
| 2013/0023093 A1 | 1/2013 | Lin et al. |
| 2013/0181297 A1 | 7/2013 | Liaw |
| 2013/0196508 A1 | 8/2013 | LiCausi |
| 2014/0001562 A1 | 1/2014 | Liaw |
| 2014/0097493 A1 | 4/2014 | Baek et al. |
| 2015/0031181 A1 | 1/2015 | Tang et al. |
| 2015/0171085 A1 | 6/2015 | Fumitake et al. |
| 2017/0338235 A1 | 11/2017 | Zang et al. |

FOREIGN PATENT DOCUMENTS

| | | |
|---|---|---|
| TW | 10-2013-0083358 A | 7/2013 |
| TW | 10-2014-0002449 A | 1/2014 |

OTHER PUBLICATIONS

Sachid, Angada, et al., "Denser and More Stable FinFET SRAM using Multiple Fin Heights", Department of Electrical Engineering and Computer Sciences, University of California Berkery, CA, USA, ISDRS 2011, Dec. 7-9, 2011.

Taiwanese Office Action issued in corresponding Taiwanese Patent Application No. 10620942970, dated Sep. 13, 2017.

Notice of Allowance issued in U.S. Appl. No. 15/340,025, dated Apr. 11, 2018 (11 pages).

Non-final Office Action issued in U.S. Appl. No. 15/340,025, dated Jan. 25, 2018 (6 pages).

* cited by examiner

METHOD OF MANUFACTURING A STATIC RANDOM ACCESS MEMORY (SRAM) USING FINFETS WITH VARYING WIDTHS OF FIN STRUCTURES

CROSS-REFERENCE TO RELATED APPLICATIONS

This application is a Divisional Application of U.S. application Ser. No. 15/340,025 filed on Nov. 1, 2016, now U.S. Pat. No. 10,050,043, which claims priority to U.S. Provisional Patent Application 62/289,157 filed Jan. 29, 2016, the entire disclosure of each of which is incorporated herein by reference.

TECHNICAL FIELD

The disclosure relates to a semiconductor integrated circuit, and more particularly to a static random access memory (SRAM) including fin field effect transistors and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET) and the use of a metal gate structure with a high-k (dielectric constant) material. The metal gate structure is often manufactured by using gate replacement technologies, and sources and drains are formed by using an epitaxial growth method. Further, a source/drain contact (a bar contact) is formed on the sources and drains.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanied drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed.

Figure 1A:
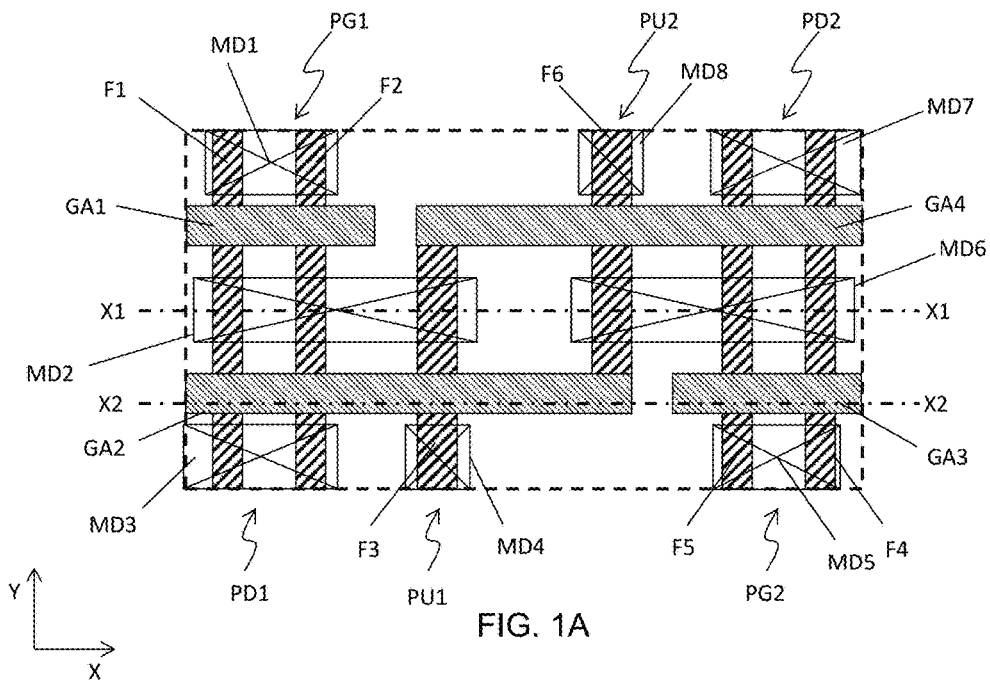
FIGS. 1A and 1B show exemplary layout structures of an SRAM cell according to one embodiment of the present disclosure.
Figure 1B:
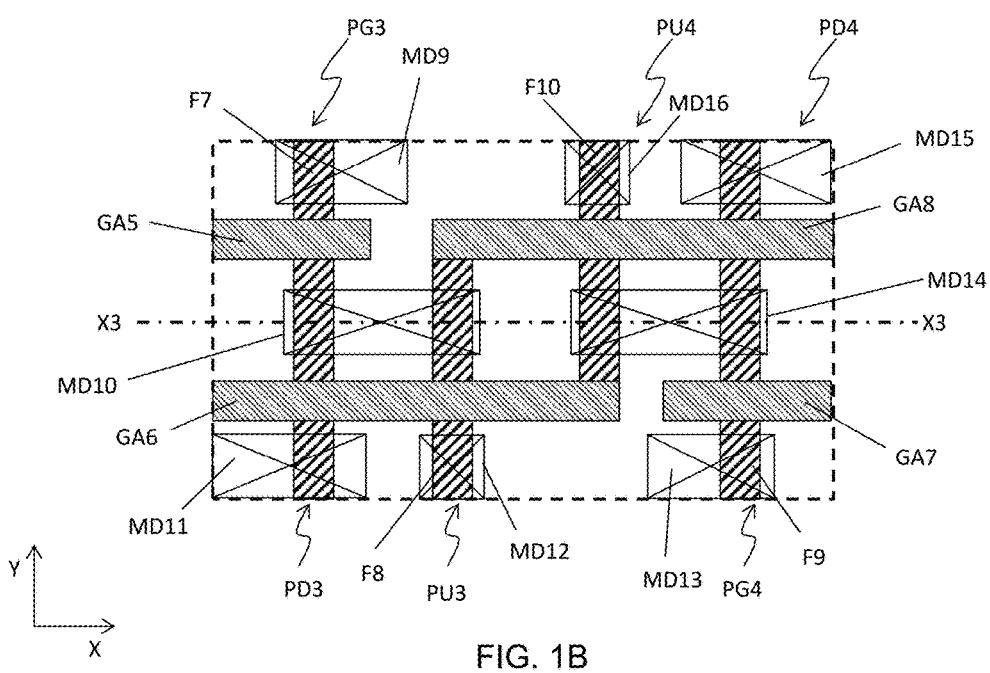
Figure 2:
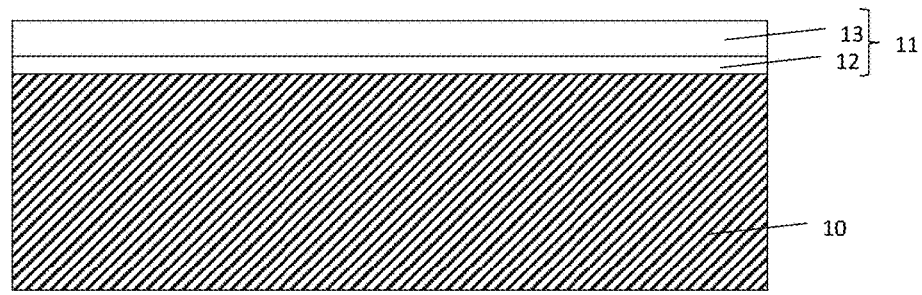
FIGS. 2, 3, 4, 5, 6A, 6B, 7, 8, 9, 10, 11, 12 and 13 show exemplary cross sectional views of various stages of manufacturing operations of a first SRAM cell including FinFETs according to one embodiment of the present disclosure.

FIGS. 1A and 1B show exemplary layout structures of an SRAM cell according to one embodiment of the present disclosure.

FIG. 1A is an exemplary layout structure of a first SRAM cell including six fin structures. FIG. 1A shows one SRAM cell. A plurality of first SRAM cells may form an SRAM array in which the plurality of first SRAM cells are arranged in a matrix along a row direction and a column direction.

The first SRAM cell includes two cross-coupled inverters having a data storage node and a complementary data storage node. The output of the first inverter is coupled to the input of the second inverter, and the output of the second inverter is coupled to the input of the first inverter. The SRAM cell further includes a first pass-gate FinFET PG1 coupled to the output of the first inverter and the input of the second inverter and a second pass-gate FinFET PG2 coupled to the output of the second inverter and the input of the first inverter.

The first inverter includes a first first-conductivity-type (a first pull-up) FinFET PU1 and a first second-conductivity-type (a first pull-down) FinFET PD1. The second inverter includes a second first-conductivity-type (a second pull-up) FinFET PU2 and a second second-conductivity-type (a second pull-down) FinFET PD2. The first pass-gate device PG1 and the second pass-gate device PG2 are second-conductive type devices. In this embodiment, the first conductive type is a P-type and the second conductive type is an N-type. Of course, it is possible in another embodiment that the first conductive type is an N-type and the second conductive type is a P-type, and in such a case the remaining elements in the SRAM are appropriately modified according to the common knowledge in the art.

The first pass-gate FinFET PG1 is constituted by a first fin structure F1, a second fin structure F2 and a first gate structure GA1 as shown in FIG. 1A. The portions of the first and second fin structures F1, F2 not covered by the first gate structure GA1 function as a source and a drain of the FinFET PG1. It is noted that in this disclosure, a source and a drain are interchangeably used and the term "a source/drain" or "an S/D" means one of a source and a drain.

The first pull-down FinFET PD1 is constituted by the first fin structure F1, the second fin structure F2 and a second gate structure GA2. The portions of the first and second fin structures F1, F2 not covered by the second gate structure GA2 function as a source and a drain of the FinFET PD1.

The first pull-up FinFET PU1 is constituted by a third fin structure F3 and the second gate structure GA2. The portions of the third fin structure F3 not covered by the second gate structure GA2 function as a source and a drain of the FinFET PU1.

The second pass-gate FinFET PG2 is constituted by a fourth fin structure F4, a fifth fin structure F5 and a third gate structure GA3. The portions of the fourth and fifth fin structures F4, F5 not covered by the third gate structure GA3 function as a source and a drain of the FinFET PG2.

The second pull-down FinFET PD2 and is constituted by the fourth fin structure F4, the fifth fin structure F5 and a fourth gate structure GA4. The portions of the fourth and fifth fin structures F4, F5 not covered by the fourth gate structure GA4 function as a source and a drain of the FinFET PD2.

The second pull-up FinFET PU2 is constituted by a sixth fin structure F6 and the fourth gate structure GA4. The portions of the sixth fin structure F6 not covered by the fourth gate structure GA4 function as a source and a drain of the FinFET PU2.

Still referring to FIG. 1A, the drains of the FinFETs PG1, PD1 and PU1 are electrically connected by a second bar contact MD2, which functions as the data storage node, and the drains of the FinFETs PG2, PD2 and PU2 are electrically connected by a sixth bar contact MD6, which functions as the complementary data storage node. The second bar contact MD2 is formed over the common drain regions of the first and second fin structures F1, F2 of the FinFETs PG1 and PD1 and the drain region of the third fin structure F3 of the FinFET PU1. The sixth bar contact MD6 is formed over the common drain regions of the fourth and fifth fin structures F4, F5 of the FinFETs PG2 and PD2 and the drain region of the sixth fin structure F6 of the FinFET PU2.

A first bar contact MD1 is formed over the source regions of the first and second fin structures F1, F2 of the FinFET PG1, a third bar contact MD3 is formed over the source regions of the first and second fin structures F1, F2 of the FinFET PD1, and a fourth bar contact MD4 is formed over the source region of the third fin structure F3 of the FinFET PU1. A fifth bar contact MD5 is formed over the source regions of the fourth and fifth fin structures F4, F5 of the FinFET PG2, a seventh bar contact MD7 is formed over the source regions of the fourth and fifth fin structures F4, F5 of the FinFET PD2, and an eighth bar contact MD8 is formed over the source region of the sixth fin structure F6 of the FinFET PU2.

The gate structures include a gate dielectric layer and a gate electrode. The source and drain regions of the fin structures include an epitaxial layer formed over the fin structure.

The gate electrodes of the first and second pass-gate FinFETs PG1, PG2 are coupled to a first word line, the first bar contact MD1 is coupled to a first bit line and the fifth bar contact MD5 is coupled to a first complementary bit line. The third bar contact MD3 and the seventh bar contact MD7 are coupled to a first potential, and the fourth bar contact MD4 and the eighth bar contact MD8 are coupled to a second potential different from the first potential. In one embodiment, the first potential is Vss, and the second potential is Vdd. When the first conductive type is an N-type and the second conductive type is a P-type, the first predetermined potential is Vdd and the second predetermined potential is Vss.

The fin structures extend in the Y direction and are arranged in parallel with each other in the X direction, and the gate structures extend in the X direction. As shown in FIG. 1A, the first widths of the first, second, fourth and fifth fin structures F1, F2, F4, F5 in the X direction are about the same, and the second widths of the third and sixth fin structures F3, F6 in the X direction are about the same. The first widths are smaller than the second widths.

FIG. 1B is an exemplary layout structure of a second SRAM cell including four fin structures. FIG. 1B shows one SRAM cell. A plurality of second SRAM cells may form an SRAM array in which the plurality of second SRAM cells are arranged in a matrix along a row direction and a column direction. The second SRAM cell is formed in the same semiconductor device (chip) as the first SRAM cell.

The second SRAM cell has a substantially similar structure to the first SRAM except for the number of fins for the pass-gate FinFETs and pull-down FinFETs.

The second SRAM cell includes a third pass-gate FinFET PG3, a fourth pass-gate FinFET PG4, a third first-conductivity-type (a third pull-up) FinFET PU3, a third second-conductivity-type (a third pull-down) FinFET PD3, a fourth first-conductivity-type (a fourth pull-up) FinFET PU4 and a fourth second-conductivity-type (a fourth pull-down) FinFET PD4.

The third pass-gate FinFET PG3 is constituted by a seventh fin structure F7 and a fifth gate structure GA5 as shown in FIG. 1B. The third pull-down FinFET PD3 is constituted by the seventh fin structure F7 and a sixth gate structure GA6. The third pull-up FinFET PU3 is constituted by an eighth fin structure F8 and the sixth gate structure GA6.

The fourth pass-gate FinFET PG4 is constituted by a ninth fin structure F9 and a seventh gate structure GA7. The fourth pull-down FinFET PD4 is constituted by the ninth fin structure F9 and an eighth gate structure GA8. The fourth pull-up FinFET PU4 is constituted by a tenth fin structure F10 and the eighth gate structure GA8.

Still referring to FIG. 1B, the drains of the FinFETs PG3, PD3 and PU3 are electrically connected by a tenth bar contact MD10, which functions as a data storage node, and the drains of the FinFETs PG4, PD4 and PU4 are electrically connected by a fourteenth bar contact MD14, which functions as the complementary data storage node. The tenth bar contact MD10 is formed over the common drain regions of the seventh fin structure F7 of the FinFETs PG3 and PD3 and the drain region of the eighth fin structure F8 of the FinFET PU3. The fourteenth bar contact MD14 is formed over the common drain regions of the ninth fin structure F9 of the FinFETs PG4 and PD4 and the drain region of the tenth fin structure F10 of the FinFET PU4.

A ninth bar contact MD9 is formed over the source region of the seventh fin structure F7 of the FinFET PG3, an eleventh bar contact MD11 is formed over the source region of the seventh fin structure F7 of the FinFET PD3, and a twelfth bar contact MD12 is formed over the source region of the eighth fin structure F8 of the FinFET PU3. A thirteenth bar contact MD13 is formed over the source region of the ninth fin structure F9 of the FinFET PG4, a fifteenth bar contact MD15 is formed over the source region of the ninth fin structure F9 of the FinFET PD4, and a sixteenth bar contact MD16 is formed over the source region of the tenth fin structure F10 of the FinFET PU4.

The gate electrodes of the third and fourth pass-gate FinFETs PG3, PG4 are coupled to a second word line, the ninth bar contact MD9 is coupled to a second bit line, and the thirteenth bar contact MD13 is coupled to a second complementary bit line. The eleventh bar contact MD11 and the fifteenth bar contact MD15 are coupled to the first potential, and the twelfth bar contact MD12 and the sixteenth bar contact MD16 are coupled to the second potential.

As shown in FIG. 1B, the third widths of the seventh to tenth fin structures F7-F10 in the X direction are about the same, and are about the same width as the second width of the first SRAM cell.

FIGS. 2-13 show exemplary cross sectional views of various stages of manufacturing operations of the first SRAM cell including FinFETs according to one embodiment of the present disclosure. It is understood that additional operations can be provided before, during, and after the processes shown by FIGS. 2-13, and some of the operations described below can be replaced or eliminated, for additional embodiments of the method. The order of the operations/processes may be interchangeable.

To fabricate fin structures for the FinFET device, a mask layer 11 is formed over a substrate 10. The mask layer 11 is formed by, for example, a thermal oxidation process and/or a chemical vapor deposition (CVD) process. The substrate 10 is, for example, a p-type silicon or germanium substrate with an impurity concentration in a range from about $1\times10^{15}$ cm$^{-3}$ to about $1\times10^{16}$ cm$^{-3}$. In other embodiments, the substrate is an n-type silicon or germanium substrate with an impurity concentration in a range from about $1\times10^{15}$ cm$^{-3}$ to about $1\times10^{16}$ cm$^{-3}$.

Alternatively, the substrate 10 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The mask layer 11 includes, for example, a pad oxide (e.g., silicon oxide) layer 12 and a silicon nitride mask layer 13 in some embodiments.

The pad oxide layer 12 may be formed by using thermal oxidation or a CVD process. The silicon nitride mask layer 13 may be formed by a physical vapor deposition (PVD), such as a sputtering method, a CVD, plasma-enhanced chemical vapor deposition (PECVD), an atmospheric pressure chemical vapor deposition (APCVD), a low-pressure CVD (LPCVD), a high density plasma CVD (HDPCVD), an atomic layer deposition (ALD), and/or other processes.

The thickness of the pad oxide layer 12 is in a range from about 2 nm to about 15 nm and the thickness of the silicon nitride mask layer 13 is in a range from about 2 nm to about 50 nm in some embodiments. A mask pattern is further formed over the mask layer. The mask pattern is, for example, a resist pattern formed by lithography operations.

Figure 3:
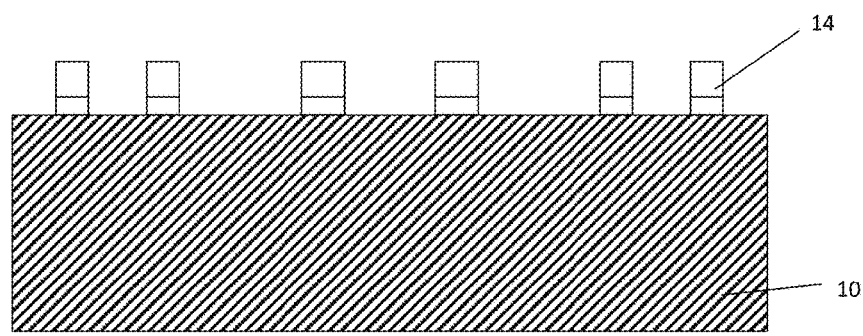

By using the mask pattern as an etching mask, hard mask patterns 14 of the pad oxide layer and the silicon nitride mask layer is formed, as shown in FIG. 3. FIG. 3 corresponds to the line X1-X1 of FIG. 1A.

Figure 4:
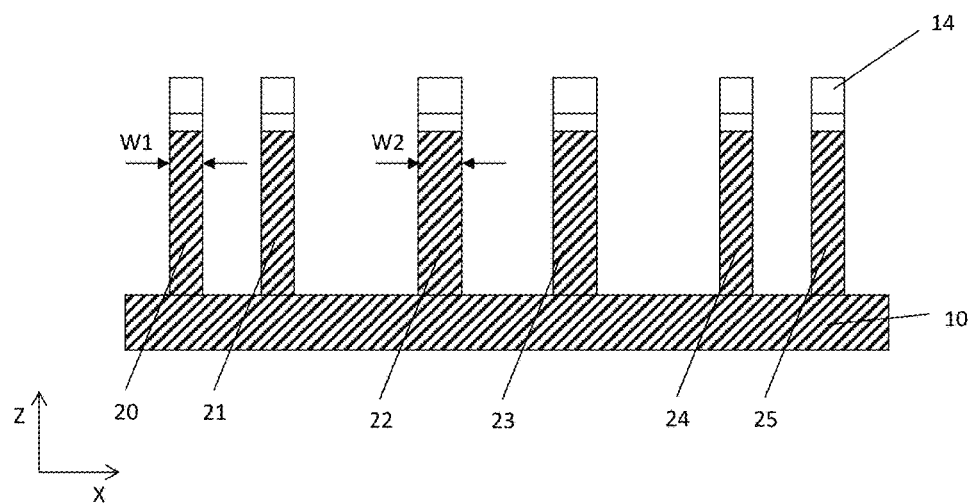

Then, as shown in FIG. 4, by using the hard mask patterns 14 as an etching mask, the substrate 10 is patterned into fin structures 20-25 by trench etching using a dry etching method and/or a wet etching method. FIG. 4 corresponds to the line X1-X1 of FIG. 1A, and the fin structures 20-25 correspond to the fin structures F1, F2, F3, F6, F5 and F4, respectively.

The fin structures may be made of the same material as the substrate 10 and may continuously extend from the substrate 10. In this embodiment, the fin structures are made of Si. The silicon layer of the fin structures may be intrinsic, or appropriately doped with an n-type impurity or a p-type impurity.

The widths of the fin structures are in a range from about 5 nm to about 40 nm in some embodiments. The first widths W1 of the fin structures 20, 21, 24 and 25 in the X direction are smaller than the second widths W2 of the fin structures 22 and 23 in the X direction. The first width and the second width are measured at the center of channel layers which are an upper part of the fin structures to be covered by a gate structure.

The height (along the Z direction) of the fin structures is in a range from about 100 nm to about 300 nm in some embodiments, and is in a range from about 50 nm to 100 nm in other embodiments.

After the fin structures 20-25 are formed, the isolation insulating layer 30 is formed in spaces between the fin structures and/or a space between one fin structure and another element formed over the substrate 10. The isolation insulating layer 30 may also be called a "shallow-trench-isolation (STI)" layer. The insulating material for the isolation insulating layer 30 may include one or more layers of silicon oxide, silicon nitride, silicon oxynitride (SiON), SiOCN, fluorine-doped silicate glass (FSG), or a low-k dielectric material. The isolation insulating layer is formed by LPCVD (low pressure chemical vapor deposition), plasma-CVD or flowable CVD. In the flowable CVD, flowable dielectric materials instead of silicon oxide may be deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove undesired element(s) to form silicon oxide. When the undesired element(s) is removed, the flowable film densifies and shrinks. In some embodiments, multiple anneal processes are conducted. The flowable film is cured and annealed more than once. The flowable film may be doped with boron and/or phosphorous.

Figure 5:
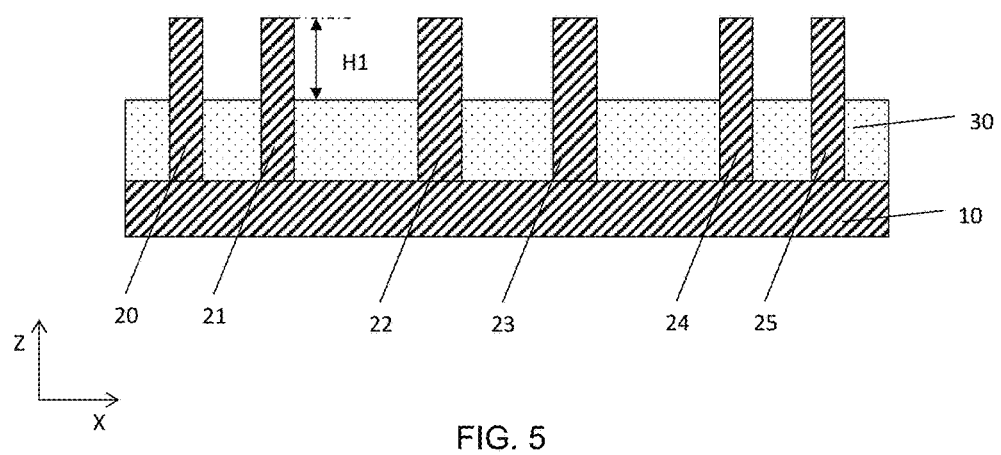

The isolation insulating layer 30 is first formed in a thick layer so that the fin structures are embedded in the thick layer, and the thick layer is recessed so as to expose the upper portions of the fin structures 20, as shown in FIG. 5. The mask patterns 14 are removed during recessing the isolation insulating layer 30.

The height H1 of the fin structures from the upper surface of the isolation insulating layer 30 is in a range from about 20 nm to about 100 nm in some embodiments, and is in a range from about 30 nm to about 50 nm in other embodiments. After or before recessing the isolation insulating layer 30, a thermal process, for example, an anneal process, may be performed to improve the quality of the isolation insulating layer 30. In certain embodiments, the thermal process is performed by using rapid thermal annealing (RTA) at a temperature in a range from about 900° C. to about 1050° C. for about 1.5 seconds to about 10 seconds in an inert gas ambient, such as an $N_2$, Ar or He ambient.

Figure 6A:
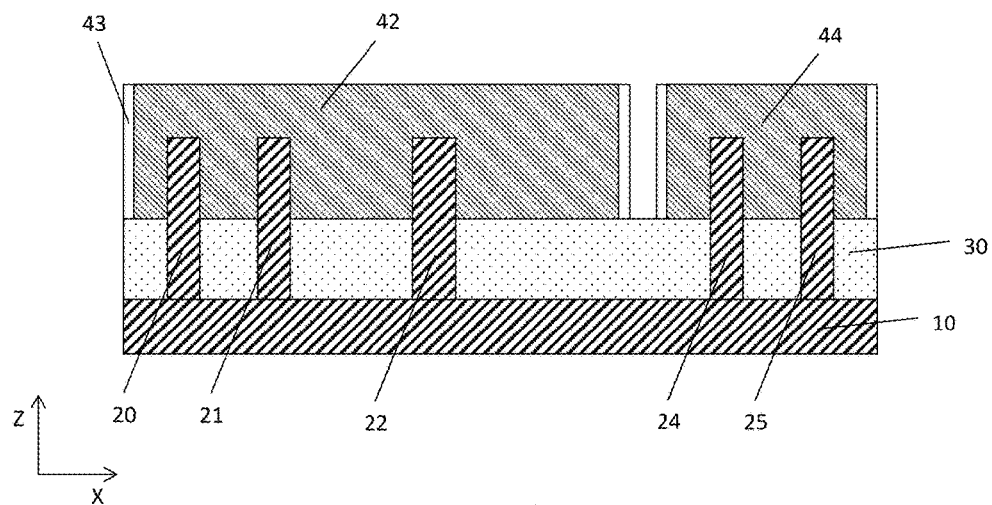

After the isolation insulating layer 30 is formed, gate structures 42 and 44 are formed over the fin structures 20-22 and 24-25, respectively, as shown in FIG. 6A. FIG. 6A corresponds to the line X2-X2 of FIG. 1A and FIG. 6B corresponds to the line X1-X1 of FIG. 1A.

As shown in FIG. 6A, the gate structures 42 and 44 extends in the X direction, while the fin structures 20-22, 24 and 25 extend in the Y direction. The gate structure 42 corresponds to the gate structure GA2 of FIG. 1A, and the gate structure 44 corresponds to the gate structure GA3 of FIG. 1A. In some embodiments, the fin structure 23 is also located under the gate structure 42.

To fabricate the gate structures 42 and 44, a dielectric layer and a poly silicon layer are formed over the isolation insulating layer 30 and the exposed fin structures, and then patterning operations are performed so as to obtain gate structures including a gate pattern made of poly silicon and a dielectric layer. In some embodiments, the polysilicon layer is patterned by using a hard mask and the hard mask remains on the gate pattern. The hard mask includes one or more layers of insulating material.

In some embodiments, the dielectric layer 42 may include one or more layers of silicon oxide, silicon nitride, silicon oxy-nitride, or high-k dielectrics. In some embodiments, a thickness of the dielectric layer 42 is in a range from about 2 nm to about 20 nm, and in a range from about 2 nm to about 10 nm in other embodiments. The polysilicon layer is formed by CVD in some embodiments.

In some embodiments, a gate replacement technology is employed. In such a case, the gate structures are dummy gate structures, which are subsequently removed.

Figure 6B:
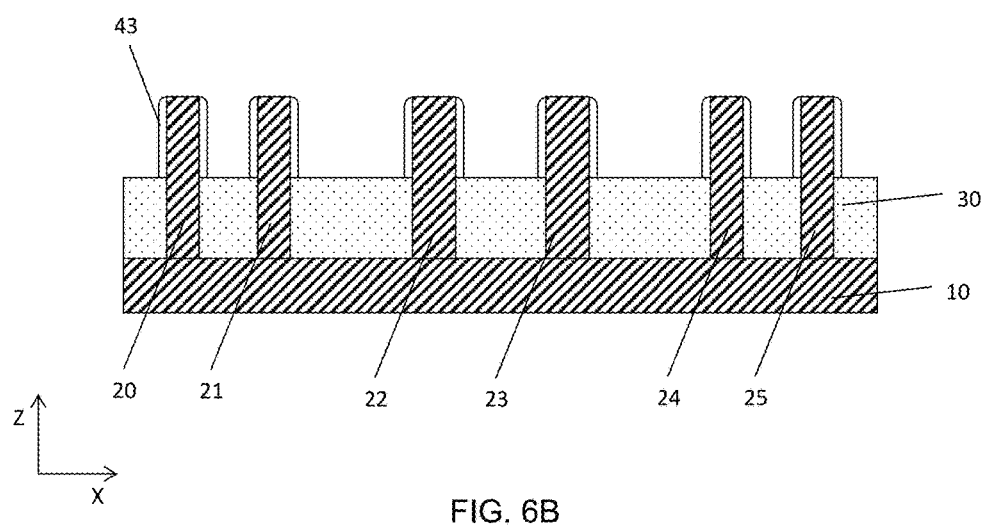

Further, sidewall spacers 43 are formed on both sidewalls of the gate structures and the exposed fin structures, as shown in FIGS. 6A and 6B. The sidewall spacers 43 include one or more layers of insulating material, such as $SiO_2$, SiN, SiON, SiOCN or SiCN, which are formed by CVD, PVD, ALD, e-beam evaporation, or other suitable process. A low-k dielectric material may be used as the sidewall spacers. The sidewall spacers 43 are formed by forming a blanket layer of insulating material and performing anisotropic etching. In one embodiment, the sidewall spacer layers are made of silicon nitride based material, such as SiN, SiON, SiOCN or SiCN.

Figure 7:
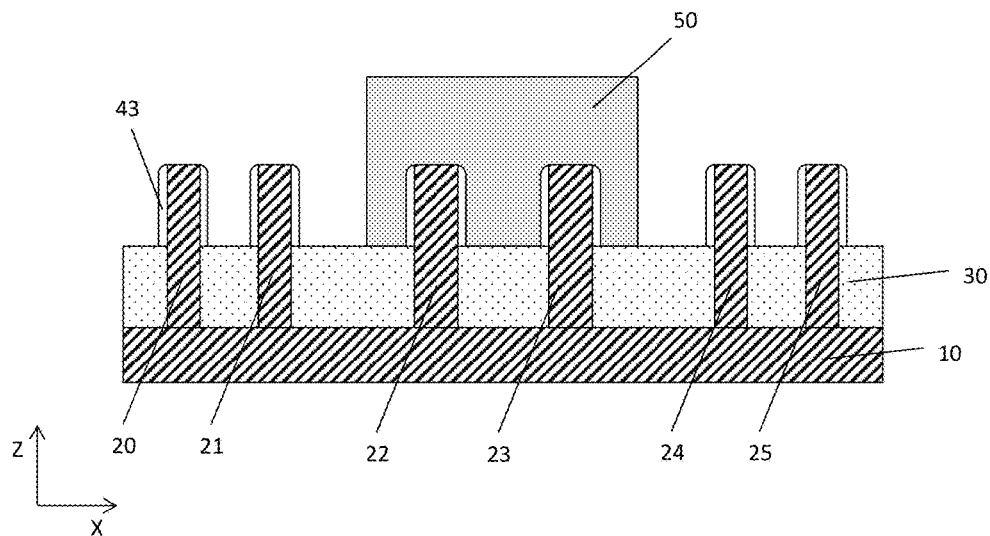

Then, as shown in FIG. 7, the fin structures 22 and 23 are covered by a first protective layer 50. The first protective layer 50 is made of dielectric material including a silicon nitride based material, such as SiN, SiON, SiOCN or SiCN. In one embodiment, SiN is used as the first protective layer 50. The first protective layer 50 is formed by depositing an insulating film by CVD, PVD, ALD, e-beam evaporation, or other suitable process, and patterning the insulating film by using a lithography process and an etching process.

Figure 8:
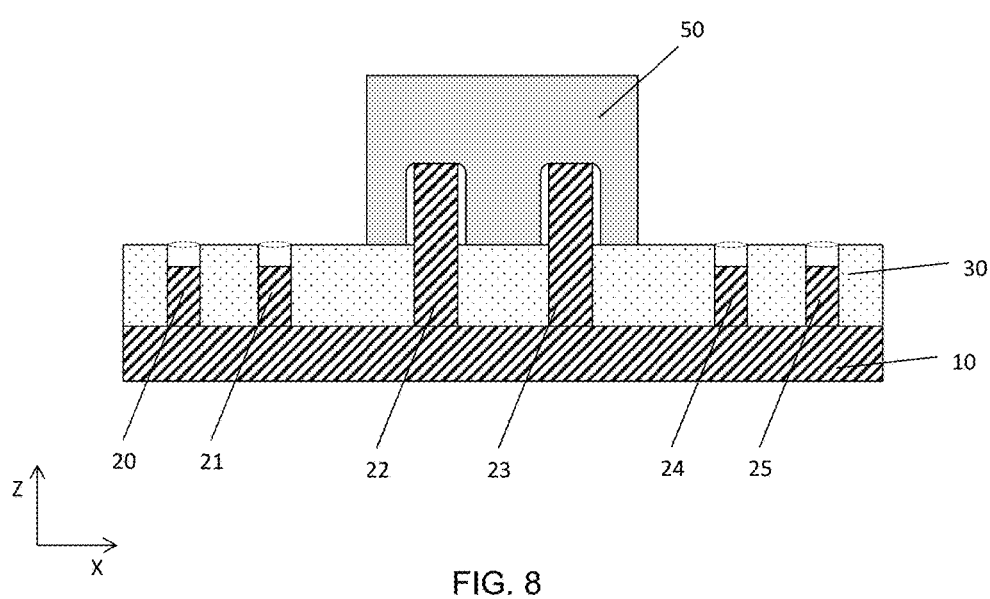

After forming the first protective layer 50, the upper portion of the fin structures 20, 21, 24 and 25, which are not covered by the first protective layer 50, are recessed. The upper portion of the fin structures 20, 21, 24 and 25 are recessed (etched) down to the level equal to or below the upper surface of the isolation insulating layer 30, as shown in FIG. 8. In other embodiments, the recessed upper portion of the fin structures 20, 21, 24 and 25 are located at the level above the upper surface of the isolation insulating layer 30.

Figure 9:
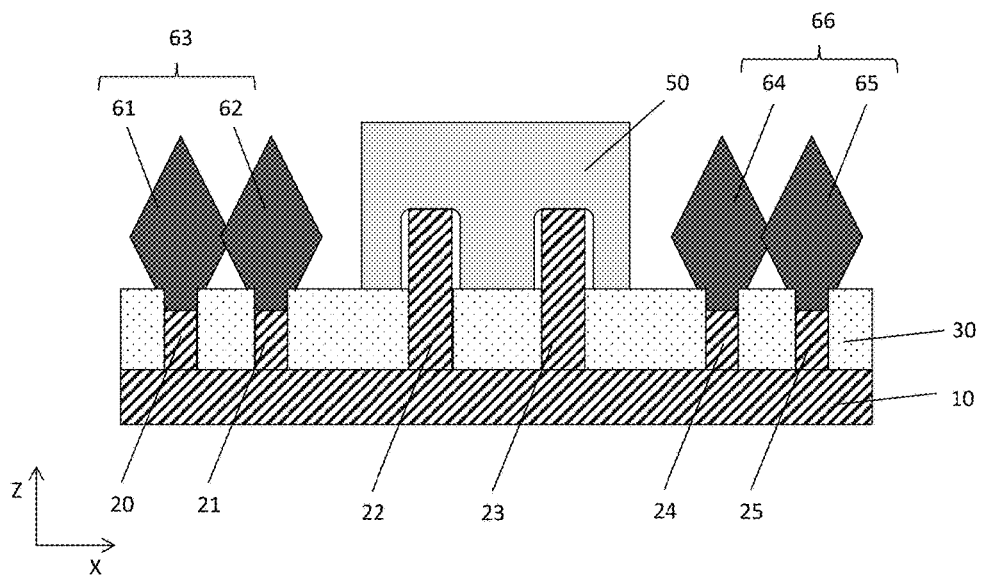

Then, as shown in FIG. 9, first epitaxial source/drain structures 61, 62, 64 and 65 are formed over the recessed fin structures 20, 21, 24 and 25, respectively. In some embodiments, as shown in FIG. 9, the first epitaxial source/drain structures 61 and 62 are merged into a merged epitaxial S/D structure 63, and the first epitaxial S/D structures 64 and 65 are merged into a merged epitaxial S/D structure 66. In one embodiment of the present disclosure, the merged epitaxial S/D structures 63 and 66 include a void.

The first epitaxial S/D structures are made of one or more layers of semiconductor material having a different lattice constant than the fin structures (channel regions). When the fin structures are made of Si, the first epitaxial S/D structures 61, 62, 64 and 65 include SiP, SiC or SiCP for an n-type FinFET. The epitaxial source/drain structures are epitaxially formed over the upper portions of the recessed fin structures, and thus have a crystalline structure. Due to the crystal orientation of the substrate formed into the fin structures (e.g., (100) plane), the first epitaxial source/drain structures 61, 62, 64 and 65 grow laterally and have a diamond-like shape.

The first epitaxial source/drain structures may be grown at a temperature of about 600 to 800° C. under a pressure of about 80 to 150 Torr, by using a Si containing gas such as $SiH_4$, $Si_2H_6$ or $SiCl_2H_2$, a C containing gas, such as $CH_4$ or $C_2H_6$, and/or a dopant gas, such as $PH_3$.

Figure 10:
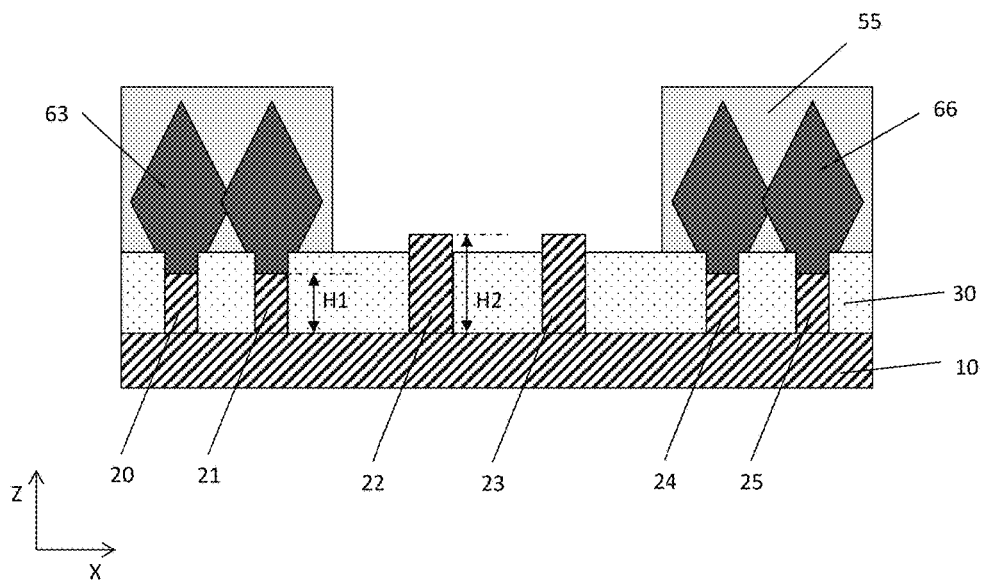

After forming the merged epitaxial S/D structures 63 and 66, the first protective layer 50 is removed and the merged epitaxial S/D structures 63 and 66 are covered by a second protective layer 55, as shown in FIG. 10. The second protective layer 55 is made of a similar material as the first protective layer 50.

After forming the second protective layer 55, the upper portion of the fin structures 22 and 23 are recessed. The upper portion of the fin structures 22 and 23 are recessed (etched) down to the level equal to or above the upper surface of the isolation insulating layer 30, as shown in FIG. 10. In other embodiments, the recessed upper portion of the fin structures 22 and 23 are located at the level below the upper surface of the isolation insulating layer 30. In one embodiment of the present disclosure, the height H1 of the fin structures 20, 21, 24 and 25 is smaller than the height H2 of the fin structures 22 and 23, as shown in FIG. 10.

Figure 11:
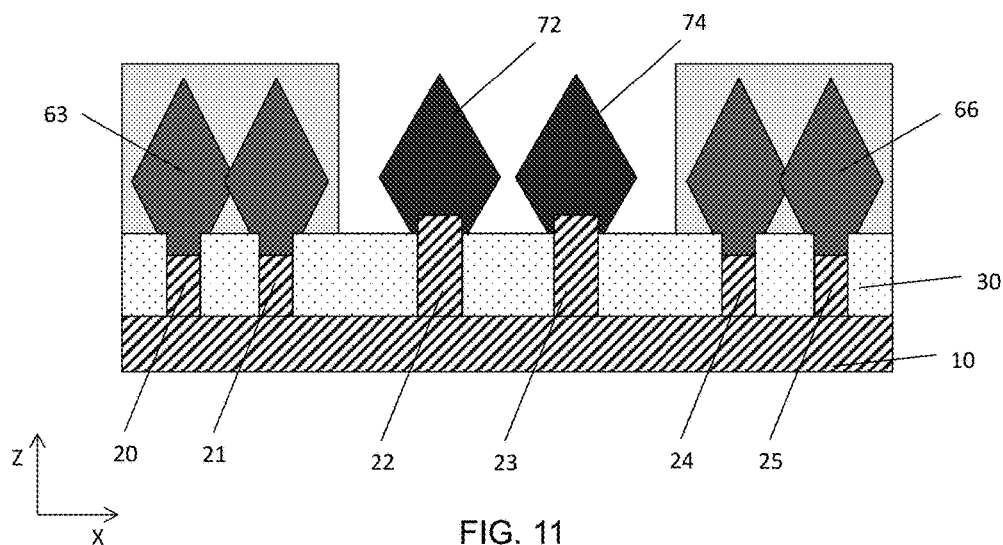

Then, as shown in FIG. 11, second epitaxial source/drain structures 72 and 74 are formed over the recessed fin structures 22 and 23, respectively. In some embodiments, as shown in FIG. 11, the second epitaxial source/drain structures 72 and 74 are not merged. In other embodiments, the second epitaxial source/drain structures 72 and 74 are not merged into a merged epitaxial S/D structure including a void.

The second epitaxial S/D structures are made of one or more layers of semiconductor material having a different lattice constant than the fin structures (channel regions). When the fin structures are made of Si, the second epitaxial S/D structures 72 and 74 include SiGe or Ge for a p-type FinFET. The second epitaxial source/drain structures are epitaxially formed over the upper portions of the recessed fin structures, and thus have a crystalline structure. Due to the crystal orientation of the substrate formed into the fin structures (e.g., (100) plane), the second epitaxial source/drain structures 72 and 74 grow laterally and have a diamond-like shape.

The second epitaxial source/drain structures may be grown at a temperature of about 600 to 800° C. under a pressure of about 80 to 150 Torr, by using a Si containing gas such as $SiH_4$, $Si_2H_6$ or $SiCl_2H_2$, and/or a Ge containing gas, such as $GeH_4$, $Ge_2H_6$ or $GeCl_2H_2$.

In the above embodiment, the second epitaxial S/D structures, e.g., for p-type FinFETs are formed after the first epitaxial S/D structures for, e.g., n-type FinFETs. In other embodiments, the first epitaxial S/D structures for n-type FinFETs are formed after the second epitaxial S/D structures for p-type FinFETs. Further, in some embodiments, after the first and second epitaxial S/D structures are formed, a silicide layer is formed over the first and second epitaxial S/D structures.

After the second epitaxial S/D structures are formed, the second protective layer 55 is removed by, for example, wet etching, and a first interlayer dielectric (ILD) layer 80 is formed over the merged epitaxial S/D structures 63 and 66 and the second epitaxial S/D structures 72 and 74.

The first ILD layer 80 includes one or more layers of insulating material, such as $SiO_2$, SiON or SiOC, or a low-k dielectric material. In one embodiment, $SiO_2$ is used as the first ILD layer 80. In some embodiments, a contact etch-stop layer (not shown), which includes one or more layers of insulating material, such as SiN, SiON, SiOCN or SiCN, is formed before forming the first ILD layer 80.

Figure 12:
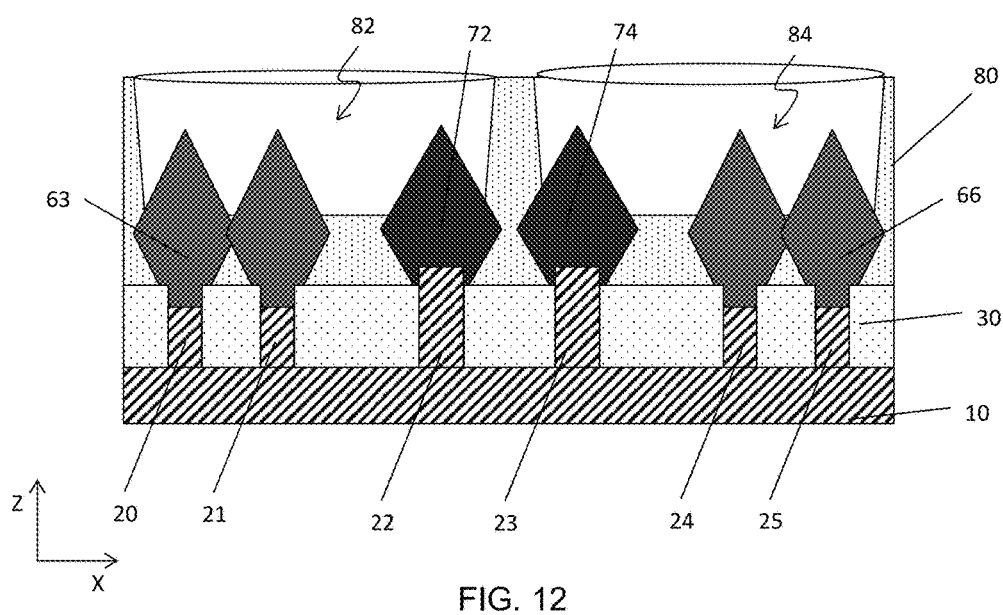

Then, by using a lithography operation and an etching operation, contact openings 82 and 84 are formed in the first ILD layer 80, as shown in FIG. 12.

Figure 13:
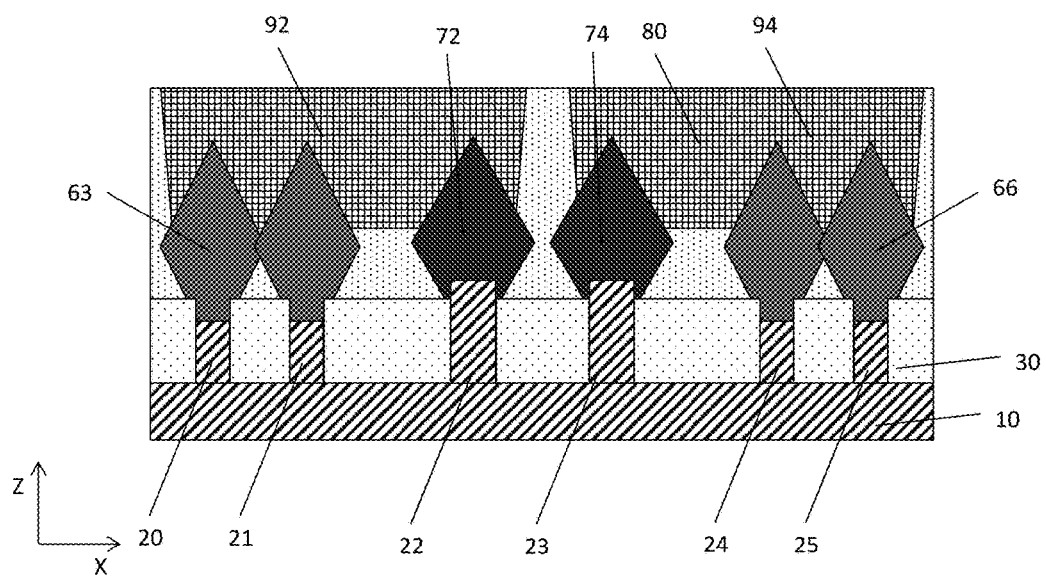

Subsequently, the contact openings 82 and 84 are filled with a conductive material, thereby forming bar contacts 92 and 94, as shown in FIG. 13. The bar contacts 92 and 94 corresponds to the bar contacts MD2 and MD6 of FIG. 1A, respectively. The bar contacts 92 and 94 are formed by forming a thick conductive material layer over the structure of FIG. 12 and performing a planarization operation, such as an etch-back process and a CMP process. The bar contacts may include a single layer or multiple layers of any suitable metal such as Co, W, Ti, Ta, Cu, Al and/or Ni and/or nitride thereof. Further, in some embodiments, before the conductive material is formed in the contact openings, a silicide layer is formed over the first and second epitaxial S/D structures, if not formed before forming the first ILD layer 80.

As shown in FIG. 13, since the width of each the fin structures 22 and 23 (for p-type FinFETs) is greater than the fin structures 20, 21, 24 and 25 (for n-type FinFETs), the volume of each of the second epitaxial S/D structures becomes greater. Accordingly, a contact area between the bar contacts 92 or 94 and each of the second epitaxial S/D structures also becomes greater. Although the width of each of the fin structures 20, 21, 24 and 25 is relatively small, a large contact area between the bar contact 92 or 94 and the merged epitaxial S/D structure 63 or 64 can be obtained due to the merged structure.

In some embodiments, a metal gate structure (not shown) is formed by a gate replacement technology after forming the first ILD 80 and before forming the contact openings 82 and 84.

After forming the bar contacts 92 and 94, further CMOS processes are performed to form various features such as additional interlayer dielectric layer, contacts/vias, interconnect metal layers, and passivation layers, etc.

Figure 14:
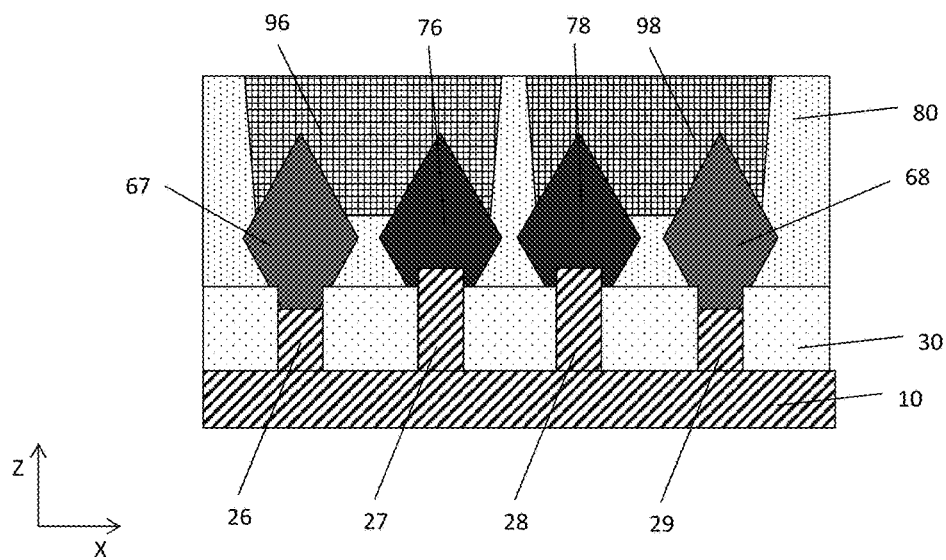
FIG. 14 shows an exemplary cross sectional view of a second SRAM cell according to one embodiment of the present disclosure.

FIG. 14 show an exemplary cross sectional views of a second SRAM cell according to one embodiment of the present disclosure. FIG. 14 corresponds to the line X3-X3 of FIG. 1B after bar contacts 96 and 98 are formed. The fin structures 26, 27, 28 and 29 correspond to the fin structures F7, F8, F10 and F9 of FIG. 1B, respectively, and the bar contacts 96 and 98 correspond to the bar contact MD10 and MD14 of FIG. 1B, respectively.

The structure of FIG. 14 for the second SRAM cell can be manufactured by the substantially similar operations to manufacture the structure of FIG. 13 for the first SRAM cell.

In FIG. 14, the third epitaxial S/D structures 67 and 68 are formed over the fin structures 26 and 29, respectively, for n-type FinFETs, and the fourth epitaxial S/D structures 76 and 78 are formed over the fin structures 27 and 28, respectively, for p-type FinFETs. The third epitaxial S/D structures are formed at the same time as the first epitaxial S/D structures, and the fourth epitaxial S/D structures are formed at the same time as the second epitaxial S/D structures.

As shown in FIG. 14, since the width of each the fin structures 26-29 for the second SRAM cell is greater than the fin structures 20, 21, 24 and 25 of n-type FinFETs for the first SRAM cell and is the same as the fin structures 22 and 23 of p-type FinFETs for the first SRAM cell, the volume of each of the third and fourth epitaxial S/D structures becomes greater. Accordingly, a contact area between the bar contacts 96, 98 and each of the third and fourth epitaxial S/D structures also becomes greater.

After forming the bar contacts 96 and 98, further CMOS processes are performed to form various features such as additional interlayer dielectric layer, contacts/vias, interconnect metal layers, and passivation layers, etc.

In the foregoing embodiments, the manufacturing operations and structures for the first SRAM cell and the second SRAM cell are described. However, the manufacturing operations and structures as described above can be applied to other semiconductor circuits, such as a logic circuit.

In the present disclosure, since larger width fin structures are employed, a volume of an epitaxial S/D structure formed over the fin structures becomes larger, thereby increasing a contact area between the epitaxial S/D structure and a bar contact. Further, by using a merged epitaxial S/D structure, a larger contact area between the epitaxial S/D structure and a bar contact can be obtained for smaller width fin structures, while obtaining a larger current by the use of two fin structures (two channels). Further, by controlling amounts of the recess etching of the fin structures 20, 21, 24 and 25 and the fin structures 22 and 23, it is possible to control a short channel effect and Idsat of the FET.

It will be understood that not all advantages have been necessarily discussed herein, no particular advantage is required for all embodiments or examples, and other embodiments or examples may offer different advantages.

In accordance with one aspect of the present disclosure, a semiconductor device includes a first FinFET and a second FinFET. The first FinFET includes a first fin structure, a first gate electrode structure disposed over a part of the first fin structure and a first source/drain region. The first fin structure extends in a first direction and the first gate electrode structure extends in a second direction crossing the first direction. The second FinFET includes one second fin structure, a second gate electrode structure disposed over a part of the second fin structure and a second source/drain region. The second fin structure extends in the first direction and the second gate electrode structure extends in the second direction. A first epitaxial layer is formed on the first fin structure in the first source/drain region, and a second epitaxial layer is formed on the second fin structure in the second source/drain region. A width of the first fin structure in the second direction is smaller than a width of the second fin structure in the second direction.

In accordance with another aspect of the present disclosure, a semiconductor device includes a first SRAM cell. The first SRAM cell includes a first to a sixth FinFET. The first FinFET is formed by a first fin structure and a second fin structure and a first gate electrode disposed over a part of the first fin structure and a part of the second fin structure. The second FinFET is formed by the first fin structure and the second fin structure and a second gate electrode disposed over a part of the first fin structure and a part of the second fin structure. The third FinFET is formed by a third fin structure and the second gate electrode disposed over a part of the third fin structure. The fourth FinFET is formed by a fourth fin structure and a fifth fin structure and a third gate electrode disposed over a part of the fourth fin structure and a part of the fifth fin structure. The fifth FinFET is formed by the fourth fin structure and the fifth fin structure and a fourth gate electrode disposed over a part of the fourth fin structure and a part of the fifth fin structure. The sixth FinFET is formed by a sixth fin structure and the fourth gate electrode disposed over a part of the sixth fin structure. The first, second, third, sixth, fifth and fourth fin structures extend in a first direction and arranged in this order in a second direction crossing the first direction. The first to fourth gate electrodes extend in the second direction. Widths of the first, second, fifth and sixth fin structures are smaller than widths of the third and sixth fin structures.

In accordance with another aspect of the present disclosure, in a method of manufacturing a semiconductor device, a first fin structure, a second fin structure and a third fin structure, which extend in a first direction, are formed over a substrate. A gate structure is formed over the first to third fin structures, the gate structure extend in a second direction crossing the first direction. The first fin structure and the second fin structure are arranged adjacent to each other. Widths of the first and second fin structures in the second direction are smaller than a width of the third fin structure in the second direction.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   forming a first fin structure, a second fin structure and a third fin structure, which extend in a first direction, over a substrate; and
   forming a first gate structure over the first to third fin structures, the first gate structure extending in a second direction crossing the first direction, wherein:
   the first fin structure and the second fin structure are arranged adjacent to each other, and
   widths of the first and second fin structures in the second direction are smaller than a width of the third fin structure in the second direction.

2. The method of claim 1, further comprising:
   forming a first source/drain epitaxial layer over the first fin structure;
   forming a second source/drain epitaxial layer over the second fin structure; and
   forming a third source/drain epitaxial layer over the third fin structure,
   wherein the first source/drain epitaxial layer is merged with the second source/drain epitaxial layer.

3. The method of claim 2, wherein:
   the forming the first source/drain epitaxial layer includes recessing the first fin structure,
   the forming the second source/drain epitaxial layer includes recessing the second fin structure,
   the forming the third source/drain epitaxial layer includes recessing the third fin structure, and
   the first and second fin structures are recessed deeper than the third fin structure.

4. The method of claim 1, further comprising forming an isolation insulating layer,
   wherein the first and second fin structures are recessed below an upper surface of the isolation insulating layer.

5. The method of claim 4, wherein the third fin structure is recessed not below the upper surface of the isolation insulating layer.

6. The method of claim 1, wherein:
   the first and second fin structures and the first gate structure constitute a first conductivity-type field effect transistor (FET), and
   the third fin structures and the first gate structure constitute a second conductivity-type FET different from the first conductivity-type.

7. The method of claim 1, further comprising:
   forming a fourth fin structure, which extends in the first direction, over a substrate; and
   forming a second gate structure over the fourth fin structure, the second gate structure extending in the second direction, wherein:
   the widths of the first and second fin structures in the second direction are smaller than a width of the fourth fin structure in the second direction.

8. The method of claim 7, further comprising:
   forming a fourth source/drain epitaxial layer over the fourth fin structure,
   wherein the third source/drain epitaxial layer is separated from the fourth source/drain epitaxial layer by an insulating material.

9. The method of claim 8, wherein:
   the forming the fourth source/drain epitaxial layer includes recessing the fourth fin structure, and
   the first and second fin structures are recessed deeper than the fourth fin structure.

10. The method of claim 7, further comprising:
    forming a fifth fin structure ad a sixth fin structure, which extend in the first direction, over a substrate; and
    forming a third gate structure over the fifth and sixth fin structures, the third gate structure extending in the second direction,
    wherein widths of the fifth and sixth fin structures in the second direction are smaller than the width of the third fin structure and the width of the fourth fin structure in the second direction.

11. The method of claim 10, further comprising:
    forming a fifth source/drain epitaxial layer over the fifth fin structure; and
    forming a sixth source/drain epitaxial layer over the sixth fin structure,
    wherein the fifth source/drain epitaxial layer is merged with the sixth source/drain epitaxial layer.

12. The method of claim 11, wherein:
the forming the fifth source/drain epitaxial layer includes recessing the fifth fin structure,
the forming the sixth source/drain epitaxial layer includes recessing the sixth fin structure, and
the fifth and sixth fin structures are recessed deeper than the third and fourth fin structures.

13. A method of manufacturing a semiconductor device including a static random access memory (SRAM) cell, the SRAM cell including: first, second, third, fourth, fifth and sixth transistors, the method comprising:
forming a first fin structure and a second fin structure for the first and second transistors, a third fin structure for the third transistor, a fourth fin structure for the fourth transistor and a fifth fin structure and a sixth fin structure for the fifth transistor and the sixth transistor;
forming an isolation insulating layer such that upper portions of the first to sixth fin structures protrude from the isolation insulating layer;
forming a first source/drain epitaxial layer over the first and second fin structures and a second source/drain epitaxial layer over the fifth and sixth fin structures;
forming a third source/drain epitaxial layer over the third fin structure and a fourth source/drain epitaxial layer over the fourth fin structure; and
forming a first contact layer connecting the first source/drain epitaxial layer and the third source/drain epitaxial layer and a second contact layer connecting the second source/drain epitaxial layer and the fourth source/drain epitaxial layer,
wherein widths of the first, second, fifth and sixth fin structures are smaller than widths of the third and fourth fin structures.

14. The method of claim 13, wherein the first source/drain epitaxial layer and the second source/drain epitaxial layer are merged epitaxial layers, respectively.

15. The method of claim 13, wherein:
the forming the first source/drain epitaxial layer includes recessing the first and second fin structures,
the forming the second source/drain epitaxial layer includes recessing the fifth and sixth fin structures,
the forming the third source/drain epitaxial layer includes recessing the third fin structure, and
the forming the fourth source/drain epitaxial layer includes recessing the fourth fin structure.

16. The method of claim 15, wherein the first, second, fifth and sixth fin structures are recessed deeper than the third and fourth fin structures.

17. The method of claim 15, wherein the first, second, fifth and sixth fin structures are recessed below an upper surface of the isolation insulating layer.

18. The method of claim 15, wherein the third and fourth fin structures are recessed not below an upper surface of the isolation insulating layer.

19. A method of manufacturing a semiconductor device including a first static random access memory (SRAM) cell and a second SRAM cell, the first SRAM cell including: first, second, third, fourth, fifth and sixth fin structures, and the second SRAM cell including seventh, eighth, ninth and tenth fin structures, the method comprising:
forming the first to tenth fin structures;
forming an isolation insulating layer such that upper portions of the first to tenth fin structures protrude from the isolation insulating layer;
forming a first source/drain epitaxial layer over the first and second fin structures, a second source/drain epitaxial layer over the fifth and sixth fin structures, a third source/drain epitaxial layer over the seventh fin structure and a fourth source/drain epitaxial layer over the tenth fin structure;
forming a fifth source/drain epitaxial layer over the third fin structure, a sixth source/drain epitaxial layer over the fourth fin structure, a seventh source/drain epitaxial layer over the eighth fin structure and an eighth source/drain epitaxial layer over the nine fin structure; and
forming a first contact layer connecting the first source/drain epitaxial layer and the third source/drain epitaxial layer, a second contact layer connecting the second source/drain epitaxial layer and the fourth source/drain epitaxial layer, a third contact layer connecting the fifth source/drain epitaxial layer and the seventh source/drain epitaxial layer, and a fourth contact layer connecting the sixth source/drain epitaxial layer and the eight source/drain epitaxial layer,
wherein widths of the first, second, fifth and sixth fin structures are smaller than widths of the third and fourth fin structures.

20. The method of claim 19, wherein the widths of the first, second, fifth and sixth fin structures are smaller than widths of the seventh to tenth fin structures.

* * * * *